(12) United States Patent
Lee et al.

(10) Patent No.: US 11,169,444 B2
(45) Date of Patent: *Nov. 9, 2021

(54) METHOD AND COMPOSITION FOR IMPROVING LWR IN PATTERNING STEP USING NEGATIVE TONE PHOTORESIST

(71) Applicant: YOUNG CHANG CHEMICAL CO., LTD, Gyeongsangbuk-do (KR)

(72) Inventors: Su Jin Lee, Daegu (KR); Gi Hong Kim, Daegu (KR); Seung Hun Lee, Daegu (KR); Seung Hyun Lee, Daegu (KR)

(73) Assignee: YOUNG CHANG CHEMICAL CO., LTD, Gyeongsangbuk-do (KR)

( * ) Notice: Subject to any disclaimer, the term of this patent is extended or adjusted under 35 U.S.C. 154(b) by 129 days.

This patent is subject to a terminal disclaimer.

(21) Appl. No.: 16/098,771

(22) PCT Filed: Apr. 26, 2017

(86) PCT No.: PCT/KR2017/004449
§ 371 (c)(1),
(2) Date: Nov. 2, 2018

(87) PCT Pub. No.: WO2017/191929
PCT Pub. Date: Nov. 9, 2017

(65) Prior Publication Data
US 2020/0183284 A1 Jun. 11, 2020

(30) Foreign Application Priority Data
May 4, 2016 (KR) ........................ 10-2016-0055177

(51) Int. Cl.
*G03F 7/40* (2006.01)
*G03F 7/038* (2006.01)

(52) U.S. Cl.
CPC .............. *G03F 7/40* (2013.01); *G03F 7/038* (2013.01)

(58) Field of Classification Search
CPC .................................. G03F 7/40; G03F 7/038
See application file for complete search history.

(56) References Cited

U.S. PATENT DOCUMENTS

| 2008/0248425 | A1 | 10/2008 | Nishiyama et al. | |
| 2009/0280440 | A1* | 11/2009 | Tarutani ................ | G03F 7/2041 |
| | | | | 430/325 |
| 2017/0170008 | A1* | 6/2017 | Park ...................... | C09D 125/08 |

FOREIGN PATENT DOCUMENTS

| JP | 2001-100435 A | 4/2001 |
| JP | 2011-033841 A | 2/2011 |
| JP | 2011-033842 A | 2/2011 |
| KR | 10-2004-0024529 A | 3/2004 |
| KR | 10-2010-0096051 A | 9/2010 |
| KR | 10-2013-0111534 A1 | 10/2013 |
| KR | 10-2013-0123164 A | 11/2013 |
| KR | 10-2014-0103187 A | 8/2014 |

* cited by examiner

*Primary Examiner* — Daborah Chacko-Davis
(74) *Attorney, Agent, or Firm* — Novick, Kim & Lee, PLLC; Jae Youn Kim

(57) ABSTRACT

The present invention relates to a method of reducing the LWR (Line Width Roughness) of a photoresist pattern using a negative tone photoresist during the fabrication of a semiconductor, and more specifically to a composition capable of reducing LWR in order to ensure a higher pattern CDU after a negative tone development process, and a processing method using the composition, thus reducing the LWR, thereby providing better CDU than existing methods.

3 Claims, 1 Drawing Sheet

Test Example 1    Test Example 3
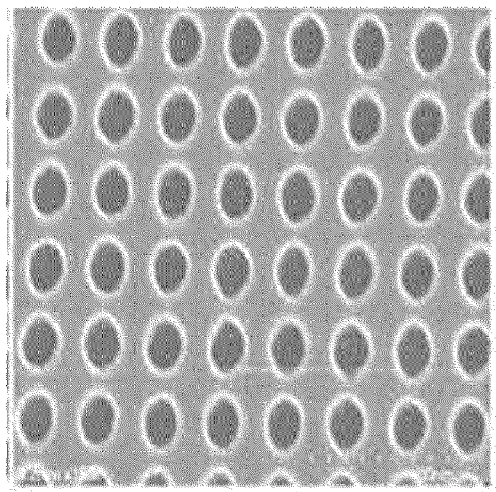 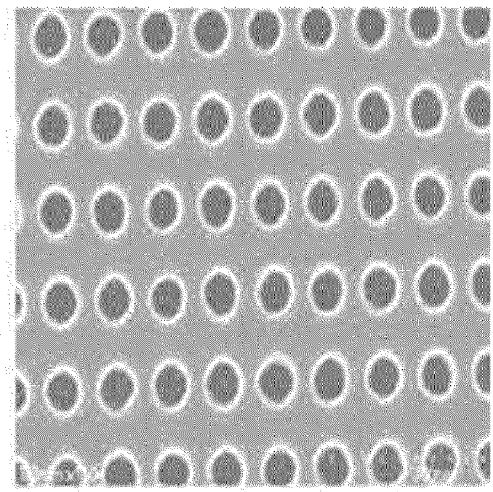

METHOD AND COMPOSITION FOR IMPROVING LWR IN PATTERNING STEP USING NEGATIVE TONE PHOTORESIST

TECHNICAL FIELD

The present invention relates to a method and composition for reducing the LWR (Line Width Roughness) of a photoresist pattern using a negative tone photoresist during the fabrication of a semiconductor.

BACKGROUND ART

With the recent trends toward miniaturization and integration of semiconductor devices, a fine pattern is required. In the formation of such a fine pattern, increasing the fineness of a photoresist pattern through the development of an exposure apparatus or the introduction of an additional process is regarded as efficient.

During the fabrication of a semiconductor in the past, a pattern has conventionally been formed on a semiconductor substrate using an i-line light source at a wavelength of 365 nm, but a light source in a smaller wavelength band is necessary in order to form a finer pattern.

A lithography technique using KrF (248 nm), ArF (198 nm) and EUV (Extreme Ultra Violet, 13.5 nm) light sources has been developed and has been commercialized or is currently being commercialized for real-world application, making it possible to realize a finer wavelength. However, as the pattern becomes finer (tens of nm), there occurs a problem in that the processing margin in the fabrication process is decreased owing to the roughness (LWR, line width roughness) of the formed pattern side wall, which is not a problem when the pattern is relatively large (hundreds of nm).

The formation of a photoresist pattern includes a positive tone development process for forming a pattern using an alkaline developing solution and a negative tone development process for forming a pattern using an organic solvent. The process of forming a pattern using a positive tone developing solution includes selectively dissolving and removing the exposed region of a photoresist film using an alkaline developing solution, and the process of forming a pattern using a negative tone developing solution facilitates the pattern formation and removes the unexposed portion and is thus more effectively able to form a photoresist pattern, compared to pattern formation using the positive tone developing solution.

Although the resolution and LWR of the negative photoresist process are better than those of the typical positive photoresist process, it is necessary to further reduce the LWR of the photoresist in order to ensure a processing margin, which is deteriorated due to the increased fineness of the pattern. With the goal of reducing LWR, many attempts have been made to improve the structure of a polymer or reduce the molecular weight of a polymer, among the constituents of the existing photoresist, or to increase the sensitivity of the photoresist to light, but a complete solution has yet to be found.

Meanwhile, thorough work has been carried out to realize a finer pattern through research into the development of a novel process, and there is demand to develop a technique for ensuring pattern uniformity by reducing the LWR of the photoresist pattern.

DISCLOSURE

Technical Problem

Accordingly, the present invention is intended to provide a composition for reducing the LWR of a photoresist pattern using a negative tone photoresist during the fabrication of a semiconductor, and a processing method using the composition.

Technical Solution

Therefore, a preferred embodiment of the present invention provides a processing solution composition for reducing the LWR of a photoresist pattern, comprising 1 to 100 wt % of a swelling material for swelling a photoresist pattern and 0 to 99 wt % of a solvent.

The processing solution composition for reducing LWR may further comprise 0 to 2 wt % of a surfactant.

In the above embodiment, the swelling material for swelling a photoresist pattern may be selected from the group consisting of an amide-based solvent, a ketone-based solvent, an ether-based solvent, an ester-based solvent, a hydrocarbon-based solvent, and a mixture thereof.

In the above embodiment, the solvent is not particularly limited, so long as it does not dissolve a resist pattern, and a solution including a typical organic solvent may be used. The solvent may be selected from the group consisting of monohydric alcohols, such as 1-pentanol, 2-pentanol, 1-hexanol, 1-heptanol, 1-octanol, 2-hexanol, 2-heptanol, 2-octanol, 3-hexanol, 3-octanol, 4-octanol, 1-butanol, 2-butanol, 3-methyl-1-butanol, and tert-butyl alcohol, ester-based solvents, such as butyl acetate, amyl acetate, ethyl-3-ethoxypropionate, 3-methoxybutylacetate, 3-methyl-3-methoxybutylacetate, butyl formate, propyl formate, ethyl lactate, and butyl lactate, and a mixture thereof.

In the above embodiment, the surfactant may be a nonionic surfactant.

In the above embodiment, the nonionic surfactant may be selected from the group consisting of polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene laurylethers, polyoxyethylene sorbitans, and mixtures thereof.

Another preferred embodiment of the present invention provides a processing method for reducing the LWR of a pattern, comprising continuously subjecting the composition prepared under the above conditions to 1) dispensing in a predetermined amount, 2) puddling for a predetermined period of time and then 3) spin drying, after a negative tone photoresist development process.

Patterning with a negative tone photoresist includes coating with a photoresist solution, soft-baking, exposure, post-exposure baking (PEB), and development with each developing solution, which is the same procedure as in a typical positive photoresist process. Subsequently, in the process using a positive photoresist, water rinsing is finally performed to remove the developing solution and the development residue, whereas in the process using a negative tone photoresist, since water and the developing solution cannot be mixed and thus water rinsing is impossible, additional developing solution is used in lieu of the water-rinsing step, or a rinse liquid in the form of an organic solvent usable in lieu of water is used to remove residue, as disclosed in Korean Patent (Application Publication No. 10-2014-0103187).

Korean Patent (Application Publication No. 10-2014-0103187) discloses a negative tone photoresist cleaning method, in which an organic solvent-type rinse liquid having the same function as the rinse using water in a positive photoresist process is used to remove residue, and an organic solvent, which neither dissolves nor swells a pattern, is selectively used and cleaning is performed through any one process selected from among spin coating, dipping, and spraying, thus removing residue that may be left behind after a development process, whereas the present invention causes fine swelling of a pattern to thus reduce LWR.

As for the treatment process, in the above-cited reference, the spin-coating process is performed in a manner in which the liquid is dispensed while the wafer to be cleaned is continuously rotated, without a puddle process, but in the present invention, it is essential to fix and puddle the wafer in order to swell the pattern.

Advantageous Effects

According to the present invention, a composition for reducing the LWR of a negative tone photoresist pattern and a process of reducing LWR using the composition enable fine swelling of a photoresist pattern to thus reduce the LWR (Line Width Roughness) of the pattern, whereby a depth of focus (DoF) margin and an energy margin (EL margin) can increase, thus improving the overall processing margin of semiconductor fabrication and remarkably decreasing the defect rates of products.

BRIEF DESCRIPTION OF DRAWING

FIG. 1 shows scanning electron microscopy images of photoresist patterns of Comparative Test Example 1 and Test Example 3.

BEST MODE

Hereinafter, a detailed description will be given of the present invention.

The present invention pertains to a composition for pattern treatment and a processing method for reducing the LWR of a pattern in a negative tone photoresist patterning process.

In the present invention, the composition for pattern treatment comprises 1 to 100 wt % of a swelling material for swelling a photoresist pattern, 0 to 99 wt % of a solvent, and 0 to 2 wt % of a surfactant.

In the present invention, the processing method includes dispensing at a speed of 5 to 50 mL/s for 1 to 20 sec, puddling for 10 to less than 90 sec, and spin drying.

Typically, the rough portion of the side wall of the pattern, which causes pattern LWR defects, may be trimmed by appropriately using the physical and chemical properties of photoresist constituents for use in the formation of a fine pattern during the fabrication of a semiconductor. Specifically, in the development process, a chemical material suitable for the physical and chemical states of the rough portion of the side wall of the pattern is used, whereby the protruding portion and the considerably recessed portion may be corrected.

In the negative tone photoresist, the size of the pattern, in which the hydrophilic photoresist remains due to excessively diffused acid, is larger by LWR variation than the fully developed pattern.

According to the present invention, the processing solution composition for reducing LWR enables the fully developed pattern portion to be swollen to a desired size based on the pattern size of the portion that is enlarged beyond the original pattern size due to excessively diffused acid, rather than control in LWR based on the fully developed pattern, whereby the pattern size may be adjusted, thus realizing LWR reduction.

The swelling material may include at least one selected from among an amide-based solvent, a ketone-based solvent, an ether-based solvent, an ester-based solvent and a hydrocarbon-based solvent.

Specific examples of the amide-based solvent may include N-methyl-2-pyrrolidone, N,N-dimethylacetamide, N,N-dimethylformamide, and 1,3-dimethyl-2-imidazolidinone.

Specific examples of the ketone-based solvent may include 1-octanone, 2-octanone, 1-nonanone, 2-nonanone, 1-hexanone, 2-hexanone, 4-heptanone, diisobutyl ketone, cyclohexanone, methylcyclohexanone, methyl ethyl ketone, methyl isobutyl ketone, diacetonyl alcohol, and acetyl carbitol.

Specific examples of the ether-based solvent may include ethylene glycol, propylene glycol, diethylene glycol, triethylene glycol, monomethylether, methoxymethyl butanol, diethylether, ethylene glycol monomethylether, propylene glycol monomethylether, propylene glycol monoethylether, diethylene glycol monomethylether, and triethylene glycol monoethylether.

Specific examples of the ester-based solvent may include propylene glycol monomethylether acetate, ethylene glycol monoethylether acetate, diethylene glycol monobutylether acetate, and diethylene glycol monoethylether acetate.

Specific examples of the hydrocarbon-based solvent may include pentane, hexane, octane, and decane.

The amount of the swelling material may be 1 to 100 wt %.

The solvent is not particularly limited, so long as it does not dissolve the resist pattern, and a solution including a typical organic solvent may be used. Particularly preferable examples of the solvent may include monohydric alcohols, such as 1-pentanol, 2-pentanol, 1-hexanol, 1-heptanol, 1-octanol, 2-hexanol, 2-heptanol, 2-octanol, 3-hexanol, 3-octanol, 4-octanol, 1-butanol, 2-butanol, 3-methyl-1-butanol, and tert-butyl alcohol, and ester-based solvents, such as butyl acetate, amyl acetate, ethyl-3-ethoxypropionate, 3-methoxybutylacetate, 3-methyl-3-methoxybutylacetate, butyl formate, propyl formate, ethyl lactate, and butyl lactate.

The amount of the solvent may be 0 to 99 wt %.

The surfactant may be any one or a mixture of two or more selected from the group consisting of nonionic surfactants, such as polyoxyethylene alkylethers, polyoxyethylene alkylphenylethers, polyoxyethylene nonylphenylethers, polyoxyethylene octylphenylethers, polyoxyethylene polyoxypropylenes, polyoxyethylene laurylethers, and polyoxyethylene sorbitans.

The surfactant plays a role in decreasing surface tension to thus increase spreadability or penetrability, thus aiding in reducing the LWR of a pattern.

The amount of the surfactant may be 0 to 2 wt %.

When the composition for reducing the LWR of the photoresist pattern is applied to the processing method, it is essential to set an appropriate process and a processing time because the photoresist formed on a normal pattern has to be finely swollen to the level of ones of nm. Although there is a difference depending on the kind of processing solution, when the puddle time is 1 sec or less in the process of reducing the LWR of the photoresist pattern on a 300 mm wafer, the swelling effect is low and thus there is almost no reduction in LWR. On the other hand, when the puddle time is 2 min or more, the processing time is increased and thus the pattern may become excessively large due to excessive swelling, undesirably increasing pattern LWR. Hence, the puddle time is preferably set to the range of less than 90 sec but exceeding 1 sec.

In a typical photoresist patterning process, a photoresist photosensitive to ArF is applied through spin coating at 1500 rpm on a 300 mm silicon wafer using a spin coater, dried (SB: Soft Baking) on a hot plate at 120° C. for 60 sec, exposed using an exposure machine for generating ArF, dried (PEB: Post-Exposure Baking) on a hot plate at 120° C. for 60 sec, and developed (negative tone development) for 30 sec using a negative tone developing solution (butyl acetate).

In the present invention, after the typical photoresist patterning process, the processing solution for reducing the LWR of the photoresist pattern is dispensed at 100 rpm at a speed of 15 mL/s for 10 sec, and puddled for 60 sec, followed by rotating the wafer at 2000 rpm for 20 sec, thereby completing the formation of a photoresist pattern.

As described above, the composition for reducing the LWR of the photoresist pattern and the processing method using the composition enable a small pattern surface to be appropriately swollen to thus reduce the LWR, whereby a high processing margin may be provided during subsequent etching or implanting processes, ultimately increasing production yield and thus reducing fabrication costs.

MODE FOR INVENTION

A better understanding of the present invention will be given through the following examples and comparative example, in which the examples are set forth merely to illustrate the present invention, but are not to be construed as limiting the scope thereof.

Example 1

A processing solution for reducing the LWR of a photoresist pattern, comprising 90 wt % of ethylene glycol and 10 wt % of 2-heptanol, was prepared as follows.

Ethylene glycol and 2-heptanol were added, stirred for 6 hr, and passed through a 0.02 µm filter, thus preparing a processing solution for reducing the LWR of a photoresist pattern.

Examples 2 to 10

Respective processing solutions for reducing the LWR of a photoresist pattern were prepared in the same manner as in Example 1 using the components in the amounts shown in Table 1 below.

Comparative Example

Butyl acetate, used as a final cleaning solution for a negative tone development process during the fabrication of a semiconductor device, was provided.

Test Example 1

A photoresist photosensitive to ArF was applied through spin coating on a 300 mm silicon wafer at 1500 rpm using a spin coater, dried (SB: Soft Baking) on a hot plate at 120° C. for 60 sec, exposed using an exposure machine for generating ArF, dried (PEB: Post-Exposure Baking) on a hot plate at 120° C. for 60 sec, and developed (negative tone development) for 30 sec using a negative tone developing solution (butyl acetate). Thereafter, the processing solution of Example 1 was dispensed at 100 rpm at a speed of 15 mL/s for 10 sec and was then puddled for 60 sec, and the wafer was rotated at 2000 rpm for 20 sec, thereby completing the formation of a photoresist pattern. Here, the formed pattern size was 45 nm.

Test Examples 2 to 40

Respective patterns were formed in the same manner as in Test Example 1 using the processing solutions of Examples 1 to 10, except for the puddle time in the pattern formation process.

Comparative Text Examples 1 to 4

Respective patterns were formed in the same manner as in Test Example 1 using butyl acetate of Comparative Example as the processing solution, except for the puddle time in the pattern formation process.

For the silicon wafers having the patterns of Test Examples 1 to 40 and Comparative Test Examples 1 to 4, LWR measurement in holes was not easy, and thus CDU (Critical Dimension Uniformity) was measured, and the extent of reduction of LWR was confirmed. The results are shown in Table 2 below.

Here, the smaller the CDU, the better the LWR.

(1) CDU (Critical Dimension Uniformity)

The difference between the X-axis and the Y-axis of the pattern was measured using a scanning electron microscope (FE-SEM, Hitachi), and thus the values of CDU were confirmed. After treatment, a 45 nm hole pattern was measured in the present test, and in a non-treatment group, the standard deviation of CDU was 4.5 nm. When the standard deviation is 3.8 nm or less, the CDU of the pattern can be deemed to be improved.

TABLE 1

|  | Swelling material | | Solvent | | Surfactant | |
| --- | --- | --- | --- | --- | --- | --- |
|  | Kind | Amount (wt %) | Kind | Amount (wt %) | Kind | Amount (wt %) |
| Example 1 | Ethylene glycol | 90 | 2-heptanol | 10 | Polyoxyethylene nonylphenylether |  |
| Example 2 | Ethylene glycol | 90 | 2-heptanol | 10 | Polyoxyethylene nonylphenylether | 0.01 |
| Example 3 | Ethylene glycol | 90 | 2-heptanol | 1 | Polyoxyethylene nonylphenylether | 1 |
| Example 4 | Ethylene glycol | 50 | 2-heptanol | 50 | Polyoxyethylene |  |

TABLE 1-continued

| | Swelling material | | Solvent | | Surfactant | |
|---|---|---|---|---|---|---|
| | Kind | Amount (wt %) | Kind | Amount (wt %) | Kind | Amount (wt %) |
| Example 5 | Ethylene glycol | 1 | 2-heptanol | 99 | Polyoxyethylene nonylphenylether | |
| Example 6 | Ethylene glycol | 99 | 2-heptanol | 1 | Polyoxyethylene nonylphenylether | |
| Example 7 | Ethylene glycol | 1 | 2-heptanol | 99 | Polyoxyethylene nonylphenylether | |
| Example 8 | 1-octanone | 80 | 2-heptanol | 20 | Polyoxyethylene nonylphenylether | |
| Example 9 | 1-octanone | 50 | 2-heptanol | 50 | Polyoxyethylene nonylphenylether | |
| Example 10 | 1-octanone | 20 | 2-heptanol | 80 | Polyoxyethylene nonylphenylether | |
| Comparative Example | Butyl acetate | 100 | | | | |

TABLE 2

| | Composition | Puddle time (sec) | CDU deviation (nm) | Improvement rate (%) (based on non-treatment group) |
|---|---|---|---|---|
| Test Example 1 | Example 1 | 10 | 3.7 | 17.7 |
| Test Example 2 | Example 1 | 30 | 3.6 | 20 |
| Test Example 3 | Example 1 | 60 | 3.5 | 22.2 |
| Test Example 4 | Example 1 | 90 | 3.9 | 13.3 |
| Test Example 5 | Example 2 | 10 | 3.3 | 26.7 |
| Test Example 6 | Example 2 | 30 | 3.2 | 28.9 |
| Test Example 7 | Example 2 | 60 | 3.2 | 28.9 |
| Test Example 8 | Example 2 | 90 | 3.9 | 13.3 |
| Test Example 9 | Example 3 | 10 | 3.4 | 24.4 |
| Test Example 10 | Example 3 | 30 | 3.3 | 26.7 |
| Test Example 11 | Example 3 | 60 | 3.4 | 24.4 |
| Test Example 12 | Example 3 | 90 | 4.0 | 11.1 |
| Test Example 13 | Example 4 | 10 | 3.7 | 17.8 |
| Test Example 14 | Example 4 | 30 | 3.8 | 15.6 |
| Test Example 15 | Example 4 | 60 | 3.8 | 15.6 |
| Test Example 16 | Example 4 | 90 | 4.1 | 8.9 |
| Test Example 17 | Example 5 | 10 | 3.7 | 17.8 |
| Test Example 18 | Example 5 | 30 | 3.7 | 17.8 |
| Test Example 19 | Example 5 | 60 | 3.7 | 17.8 |
| Test Example 20 | Example 5 | 90 | 3.9 | 13.3 |
| Test Example 21 | Example 6 | 10 | 3.8 | 15.6 |
| Test Example 22 | Example 6 | 30 | 3.7 | 17.8 |
| Test Example 23 | Example 6 | 60 | 3.7 | 17.8 |
| Test Example 24 | Example 6 | 90 | 4.1 | 8.9 |
| Test Example 25 | Example 7 | 10 | 3.8 | 15.6 |
| Test Example 26 | Example 7 | 30 | 3.8 | 15.6 |
| Test Example 27 | Example 7 | 60 | 3.7 | 17.8 |
| Test Example 28 | Example 7 | 90 | 3.9 | 13.3 |
| Test Example 29 | Example 8 | 10 | 3.8 | 15.6 |
| Test Example 30 | Example 8 | 30 | 3.8 | 15.6 |
| Test Example 31 | Example 8 | 60 | 3.8 | 15.6 |
| Test Example 32 | Example 8 | 90 | 3.9 | 13.3 |
| Test Example 33 | Example 9 | 10 | 3.8 | 15.6 |
| Test Example 34 | Example 9 | 30 | 3.8 | 15.6 |
| Test Example 35 | Example 9 | 60 | 3.8 | 15.6 |
| Test Example 36 | Example 9 | 90 | 4.1 | 8.9 |
| Test Example 37 | Example 10 | 10 | 3.7 | 17.8 |
| Test Example 38 | Example 10 | 30 | 3.8 | 15.6 |
| Test Example 39 | Example 10 | 60 | 3.8 | 15.6 |
| Test Example 40 | Example 10 | 90 | 4 | 11.1 |
| Comparative Test Example 1 | Comparative Example | Non-treatment group | 4.5 | 0 |
| Comparative Test Example 2 | Comparative Example | 10 | 4.7 | 4.4 |
| Comparative Test Example 3 | Comparative Example | 30 | 4.6 | 2.2 |
| Comparative Test Example 4 | Comparative Example | 60 | 4.6 | 2.2 |
| Comparative Test Example 5 | Comparative Example | 90 | 4.6 | 2.2 |

As described above, as the standard deviation of CDU approaches 3.8 nm, the pattern is regarded as increasingly uniform (LWR is reduced). When the CDU deviation is lower, the EL margin and DoF margin are high, thus resulting in a good processing margin.

Based on the test results, upon treatment with processing solution compositions for reducing LWR in the puddle time range of 10 to 60 sec, although there are some differences depending on the amount of the swelling material, CDU can be confirmed to be improved by 15% or more compared to a non-treatment group (Comparative Test Example 1).

The invention claimed is:

1. A composition for reducing an LWR (Line Width Roughness) of a negative tone photoresist pattern on a wafer, the composition comprising:
    100 parts by weight of ethylene glycol as a swelling material for swelling the negative tone photoresist pattern on the wafer;
    1.11 to 11.1 parts by weight of 2-heptanol as a solvent enabling material dissolution and mixing; and
    0.0111 to 1.11 parts by weight of polyoxyethylene non-ylphenylether as a nonionic surfactant.

2. A method of reducing an LWR (Line Width Roughness) of a negative tone resist pattern formed on a wafer by a development process using a negative tone photoresist, the method comprising:
    1) dispensing a composition for reducing the LWR on the negative tone photoresist pattern on the wafer;
    2) puddling for a predetermined period of time; and
    3) spin drying,
    wherein the composition for reducing the LWR comprises:
    100 parts by weight of ethylene glycol as a swelling material for swelling the negative tone photoresist pattern;
    1.11 to 11.1 parts by weight of 2-heptanol as a solvent enabling material dissolution and mixing; and 0.0111 to 1.11 parts by weight of polyoxyethylene nonylphenylether as a nonionic surfactant.

3. The method of claim 2, wherein the composition is dispensed at a speed of 5 to 50 mL/s and is puddled for 10 to 60 seconds.

* * * * *